United States Patent
Kumbhat et al.

(10) Patent No.: US 9,907,169 B1
(45) Date of Patent: Feb. 27, 2018

(54) PRINTED CIRCUIT BOARD (PCB) AND PCB ASSEMBLY HAVING AN ENCAPSULATING MOLD MATERIAL ON A BOTTOM SURFACE THEREOF AND METHODS FOR MOLDING AN ENCAPSULATING MOLD MATERIAL ON A BOTTOM SURFACE OF A PCB

(71) Applicant: Avago Technologies General IP (Singapore) Pte. Ltd., Singapore (SG)

(72) Inventors: Nitesh Kumbhat, San Jose, CA (US); Li Sun, Fremont, CA (US); Aaron Lee, Seoul (KR); Deog-Soon Choi, Seoul (KR); Hyun-Mo Ku, Seoul (KR); Jack Ajoian, Campbell, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/251,230

(22) Filed: Aug. 30, 2016

(51) Int. Cl.
  *H05K 1/11* (2006.01)
  *H05K 1/02* (2006.01)
  *H05K 9/00* (2006.01)
  *H05K 1/18* (2006.01)
  *H05K 1/03* (2006.01)
  *H05K 3/00* (2006.01)

(52) U.S. Cl.
  CPC .......... *H05K 1/111* (2013.01); *H05K 1/0271* (2013.01); *H05K 1/0373* (2013.01); *H05K 1/185* (2013.01); *H05K 3/0014* (2013.01); *H05K 9/0081* (2013.01); *H05K 2201/068* (2013.01); *H05K 2201/10977* (2013.01)

(58) Field of Classification Search
  CPC ........ H05K 1/11; H05K 1/111; H05K 3/0011; H05K 3/0014; H05K 1/185
  See application file for complete search history.

(56) References Cited

U.S. PATENT DOCUMENTS

| 6,310,298 B1 | 10/2001 | Barrett et al. |
| 7,964,938 B2 | 6/2011 | Yoon et al. |
| 8,296,938 B2 | 10/2012 | Carey et al. |

(Continued)

FOREIGN PATENT DOCUMENTS

CN  203941944 U  11/2014

OTHER PUBLICATIONS

English language machine translation of CN203941944U, published Nov. 23, 2014.

*Primary Examiner* — Hoa C Nguyen (57) ABSTRACT

A process for forming an encapsulating mold compound into a molded solder mask on a bottom surface of a PCB is provided that allows the molded solder mask to have a very precise, preselected thickness, or height, while also ensuring that no gaps between the solder mask and side walls of the electrical contact pads exist. A circuit board and circuit board assembly that incorporate the molded solder mask are also provided. The molded solder mask is fabricated in such a way that overlap between the molded solder mask and the electrical contact pads and gaps between the molded solder mask and the side walls of the electrical contact pads are avoided. In addition, the molded solder mask allows the pitch between adjacent electrical contact pads to be greatly reduced compared to the pitch that is possible using a traditional solder mask formed by the traditional photolithographic approach.

22 Claims, 9 Drawing Sheets

(56) References Cited

U.S. PATENT DOCUMENTS

| | | |
|---|---|---|
| 8,420,437 B1 | 4/2013 | Fan |
| 8,637,963 B2 | 1/2014 | Upadhyayula et al. |
| 8,962,452 B2 | 2/2015 | Grivna |
| 9,412,703 B1 * | 8/2016 | Huang .............. H01L 23/49838 |
| 2001/0038150 A1 | 11/2001 | Suzuki |
| 2007/0166884 A1 | 7/2007 | Li et al. |
| 2014/0124254 A1 | 5/2014 | Zhang et al. |
| 2014/0138816 A1 | 5/2014 | Lu et al. |
| 2016/0064317 A1 * | 3/2016 | Hsu ...................... H05K 3/4682 174/264 |
| 2017/0047279 A1 * | 2/2017 | Hu .................... H01L 23/49838 |

\* cited by examiner

FIG. 9

PRINTED CIRCUIT BOARD (PCB) AND PCB ASSEMBLY HAVING AN ENCAPSULATING MOLD MATERIAL ON A BOTTOM SURFACE THEREOF AND METHODS FOR MOLDING AN ENCAPSULATING MOLD MATERIAL ON A BOTTOM SURFACE OF A PCB

FIELD OF THE INVENTION

The invention relates to printed circuit boards (PCBs), and more particularly, to encapsulating a bottom surface of a PCB in a mold material to form a solder mask on the bottom surface of the PCB.

BACKGROUND

PCBs are used in a variety of electrical, electronic and optoelectronic applications for mounting and electrically interconnecting electrical, electronic and/or optoelectronic components. A typical PCB comprises layers of organic dielectric substrate material, typically referred to as prepreg, having layers of metal embedded therein that are often patterned to provide electrical signal routing. The metal layers are often interconnected by electrically-conductive vias to allow the electrical signals to be routed vertically through multiple layers of the PCB.

A typical PCB manufacturing process is a build-up process in which the layers are built one layer at a time. The build-up process typically comprises using dry dielectric film masking steps to selectively mask regions of a metal seed layer disposed on a starting structure, electroplating onto the unmasked regions of the metal seed layer to form a patterned metal layer, removing the dry dielectric film layer and the metal seed layer below it, laminating a layer of dielectric prepreg material on top of the patterned metal layer, drilling one or more via holes through the laminated dielectric prepreg, cleaning the via holes, forming a metal seed layer on the walls of the via holes, and electroplating metal onto the via holes and onto the non-masked areas of the seed layer to simultaneously fill the via holes with metal and form the patterned metal layer. The process is then repeated to form each additional PCB layer.

On one or both of the outer PCB layers, electrical contact pads are formed by electroplating a layer of metal, typically copper, onto the metal seed layer. After the layer of copper has been plated onto the metal seed layer, a finishing layer of metal, which is often a layer of gold (Au) or Nickel-Gold (NiAu), is plated onto the top surfaces of the copper electrical contact pads. The exposed portions of the metal seed layer are then etched away. A solder mask dielectric material layer, typically a photoimageable polymer material, is then applied (e.g., by spin coating) on top of and in between the electrical contact pads. A second dielectric material layer is then formed on top of the solder mask dielectric material layer and patterned to expose only the portions of the solder mask dielectric material layer that are in between the electrical contact pads. The second dielectric material layer and the exposed portions of the solder mask dielectric material layer are then subjected to radiation. The second dielectric material layer and the unexposed portions of the solder mask dielectric material layer that are on top of the electrical contact pads are then removed such that only the electrical contact pads and the solder mask dielectric material in between the electrical contact pads remain on the PCB surface. The remaining dielectric material constitutes the solder mask.

Figure 1A:
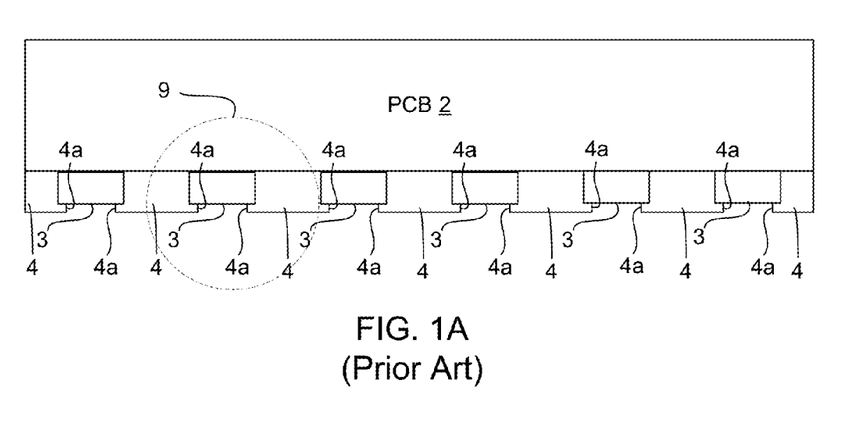
FIG. 1A illustrates a cross-sectional view of a PCB having a conventional, photolithographically-formed solder mask that is formed during a known PCB fabrication process.
Figure 1B:
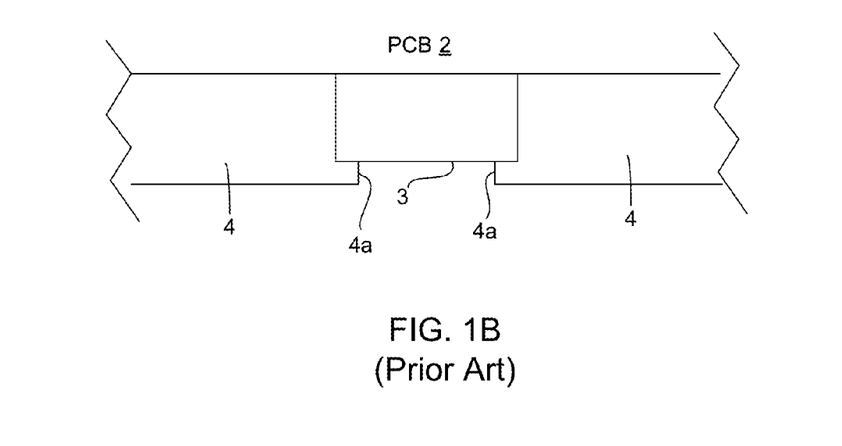
FIG. 1B illustrates an enlarged cross-sectional view of a portion of the PCB shown in FIG. 1A.

FIG. 1A illustrates a side cross-sectional view of a PCB 2 having an array of electrical contact pads 3 and a conventional, photolithographically-formed solder mask 4 disposed on the bottom surface thereof. FIG. 1B illustrates an enlarged cross-sectional view of the portion of the PCB 2 shown in the dashed circle 9 in FIG. 1A. The array of electrical contact pads 3 may be, for example, a land grid array (LGA). When the solder mask is applied on top of and in between the electrical contact pads, it is applied with a thickness that is at least slightly greater than the height of the electrical contact pads. Typically, portions 4a of the solder mask 4 overlap the electrical contact pads 3, whch can lead to problems when testing the PCB 2 or later during operations due to poor electrical connections between the electrical contact pads 3 and external electrical contacts, e.g., electrical contact pads of a system PCB (not shown) on which the PCB 2 is mounted. If the thickness of the solder mask 4 is much greater than the height of the electrical contact pads 3, the solder mask 4 becomes very heavy and can cause the PCB 2 to bow, or drawbridge, which can lead to other problems, such as delamination and poor electrical connections, for example.

Figure 2A:
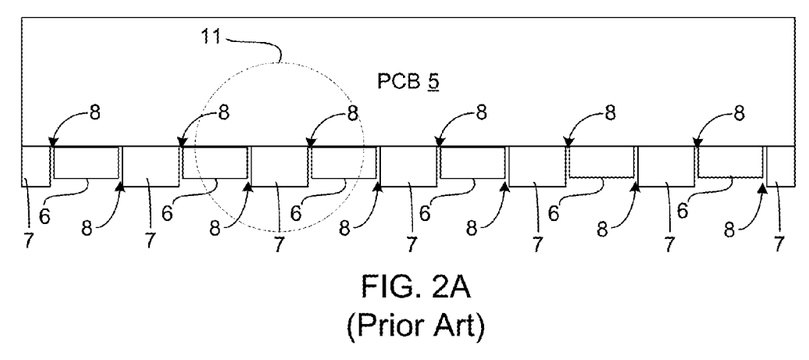
FIG. 2A illustrates a cross-sectional view of a PCB having a conventional photolithographically-formed solder mask that is formed during a known PCB fabrication process.
Figure 2B:
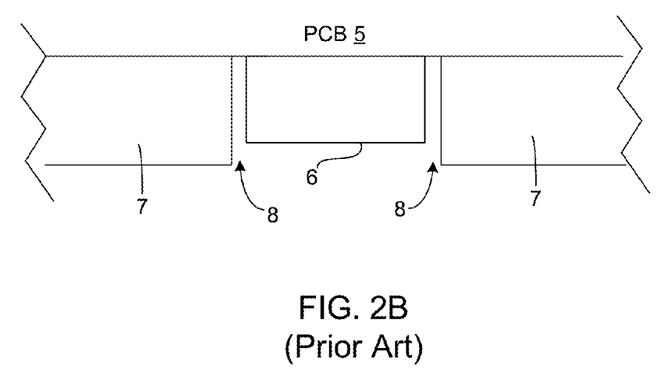
FIG. 2B illustrates an enlarged cross-sectional view of a portion of the PCB shown in in FIG. 2A.

FIG. 2A illustrates a side cross-sectional view of a PCB 5 having an array of electrical contact pads 6 and a conventional, photolithographically-formed solder mask 7 disposed on the bottom surface thereof. FIG. 2B illustrates an enlarged cross-sectional view of the portion of the PCB 5 shown in the dashed circle 11 in FIG. 2A. In this case, gaps 8 exist between the side walls of the electrical contact pads 6 and the solder mask 7. The gaps 8 can be caused by inaccuracies during the steps of exposing and developing particular areas of the dielectric material layer that covers the solder mask and/or during the steps of exposing and developing the dielectric material of the solder mask. These gaps 8 can result in electrical shorts and they can make any underlying electrical traces vulnerable to oxidation.

Accordingly, a need exists for a method of forming a solder mask that allows the solder mask to have a very precise, preselected thickness and that ensures that there are no gaps between the solder mask and the side walls of the electrical contact pads. A need also exists for a PCB assembly that incorporates the solder mask.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale, emphasis instead being placed upon illustrating the principles of the invention. The drawings should not be interpreted as limiting the scope of the invention to the example embodiments shown herein.

WRITTEN DESCRIPTION

Throughout this description, embodiments and variations are described for the purpose of illustrating uses and implementations of inventive concepts. The illustrative description should be understood as presenting examples of inventive concepts, rather than as limiting the scope of the concept as disclosed herein. It should also be understood that the word "example," as used herein, is intended to be non-exclusionary and non-limiting in nature. More particularly, the word "exemplary" as used herein indicates one among several examples, and it should be understood that no undue emphasis or preference is being directed to the particular example being described.

In terms of a general overview, a process for forming a solder mask on a bottom surface of a PCB is provided that allows the solder mask to have a very precise, preselected thickness, or height, while also ensuring that no gaps between the solder mask and side walls of the electrical contact pads exist. As described above with reference to FIGS. 1A-1B and 2A-2B, the traditional approach of forming a solder mask relies on photolithographic masking and exposure steps to form a polymer solder mask in between the electrical contact pads. With the traditional approach, problems can occur, such as the bottom surface of the solder mask overlapping the bottom surfaces of the electrical contact pads, gaps occurring between the solder mask and the side walls of the electrical contact pads and localized bowing, or bending, of the PCB in cases where the solder mask is very thick due to the electrical contact pads having great heights. In contrast, the solder mask described herein comprises an encapsulating mold compound that is molded onto the bottom surface of the PCB. Because molding can be performed with great precision, the solder mask disclosed herein can have a preselected thickness that is achieved with great precision, thereby allowing the aforementioned problems associated with traditional solder masks to be avoided.

With the traditional photolithographic approach to forming a solder mask, the thickness of the solder mask is typically at least about 15 micrometers (microns) greater than the height of the electrical contact pads, which can lead to the aforementioned overlapping problem. It can also lead to localized bowing for large electrical contact pad heights due to the increased weight of the solder mask. In contrast, if the goal is to make the bottom surface of the molded solder mask described herein co-planar, or flush, with the bottom surfaces of the electrical contact pads, this can be achieved with an accuracy of within a few microns. For example, the difference between a co-planar molded solder mask in accordance with this disclosure and the height of the electrical contact pads will typically be negligible, i.e., in the range from 0 microns (i.e., precisely co-planar) to about 3 microns, while also completely obviating the overlap problem. This small difference also ensures that localized bending will not occur, even in cases where the height of the electrical contact pads is great, i.e., up to about 30 microns in height. In contrast, with the traditional approach, the large difference between the thickness of the solder mask and the height of the electrical contact pads results in the weight of the solder mask producing localized bending in the PCB when the electrical contact pads are large in height. Thus, the traditional approach imposes limits on the height that the electrical contact pads can have.

In addition, the molded solder mask disclosed herein allows the pitch of the electrical contact pads to be smaller than with the traditional approach. With the traditional approach, a pitch of less than about 400 microns is generally not possible. In contrast, with the molded solder mask, a pitch of, for example, 350 microns is easily achievable, although smaller pitches are also possible. The reduction in pitch provides advantages in terms of reducing the overall size of PCBs and of packages in which the PCBs are incorporated.

The encapsulating mold compound of which the molded solder mask is made may be any suitable material having suitable flowability characteristics for flowing on the bottom surface of the PCB, suitable adhesion characteristics for adhering to the bottom surface of the PCB and suitable dielectric characteristics for acting as an electrical insulator. The encapsulating mold compound may be, for example, plastic, epoxy, silicone, ceramic, polymer resin, or any other suitable material that can be molded into a predetermined form or shape using a conventional or any suitable molding process. In one embodiment, the encapsulating mold compound may be mold compounds of the type used for encapsulating electronic components, such as plastics. In another embodiment, the encapsulating mold compound is epoxy resin. Unlike conventional solder masks, which have shapes that are formed photolithographically, the shape of the molded solder mask described herein is complementary in shape to a mold cavity of a mold tool that is used to form the molded solder mask. Because the film-assisted mold tool covers the bottom surfaces of the electrical contact pads prior to the encapsulating mold material being injected or dispensed into the mold cavity, the encapsulating mold compound never comes into contact with the bottom surfaces of the electrical contact pads, and therefore no residue is found on those surfaces. In addition, for this same reason, there is no possibility that the molded solder mask will overlap the bottom surfaces of the electrical contact pads.

The top surface of a PCB assembly typically has an encapsulating mold compound molded onto its top surface that encapsulates and protects components mounted on the top surface of the PCB and electrical conductors or traces disposed on the top surface of the PCB. With the traditional approach, this top mold is typically between 300 and 600 microns and can be relatively heavy. The top mold can cause warpage to occur along one or more surfaces of the PCB assembly. Warpage can be defined by measuring the height, h, of the bottom surface of PCB relative to the outermost edges of the bottom surface of the PCB. Warpage is observed when the height h of the PCB assembly measured along the vertical dimension from a horizontal plane varies across the bottom surface of the PCB.

One of the benefits of the molded solder mask formed on the bottom surface of the PCB in accordance with embodiments disclosed herein is that the weight of the molded solder mask offsets the weight of the top mold and reduces warpage by anywhere from about 2% to 15%. The amount by which the molded solder mask reduces warpage depends on the encapsulating mold compounds that are used for the molded solder mask and for the top mold. The solder mask typically has a thickness that ranges from about 20 to 30 microns. Because the thickness of the top mold (e.g., 200 to 300 microns in thickness) is significantly greater than the thickness of the molded solder mask, choosing an encapsulating mold compound for the molded solder mask that has a coefficient of thermal expansion (CTE) that is significantly higher than the CTE of the encapsulating mold compound used for the top mold will result in a greater warpage reduction than if the same encapsulating mold compound is used for the top mold and molded solder mask. However, in some cases the same encapsulating mold compound is used for the top mold and the molded solder mask. A few exemplary embodiments of the method of forming the molded solder mask and of PCBs that incorporate the molded solder masks will now be described with reference to FIGS. 3A-9.

FIGS. 3A-3E illustrate cross-sectional views of a PCB 10 during various processing steps that are performed in accordance with an exemplary embodiment to mold the encapsulating mold compound onto a bottom surface of the PCB 10 to form the molded solder mask. For ease of illustration and discussion, it will be assumed that various steps in fabricating the PCB 10 have already been performed. For example, in the case where the PCB 10 is a multi-layer PCB, several processing steps are performed to form the various layers of the PCB and other elements, components or features of the PCB. Because such processing steps are not germane to the process for forming the molded solder mask, they are omitted. Also, during the process of forming the molded solder mask, other processing steps that are not explicitly described herein may be performed.

Figure 3A:
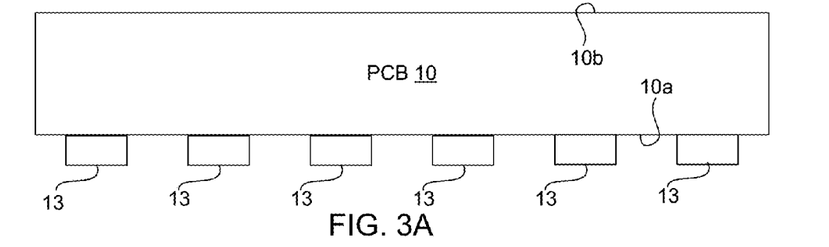
FIGS. 3A-3E illustrate cross-sectional views of various stages of a fabrication process in accordance with an exemplary embodiment for forming a solder mask by encapsulating the bottom surface of a PCB with an encapsulating mold material and using a mold tool to impart a predetermined shape to the encapsulating mold material.

With reference to FIG. 3A, an array of electrical contact pads 13 is formed on the bottom surface 10a of the PCB 10. The array of electrical contact pads 13 may be, for example, an LGA. The manner in which an array of electrical contact pads may be formed on a surface of a PCB is well known and typically involves forming a thin metal seed layer on the bottom surface of the PCB, depositing a dry dielectric film layer on top of the metal seed layer, patterning the dry dielectric layer through selective exposure and development steps (photolithography) to form a dielectric mask over the metal seed layer, electroplating a layer of copper onto the unmasked areas of the metal seed layer, removing the dielectric mask, and removing all of the metal seed layer that is not underneath an electrical contact pad. The electroplated copper forms the array of electrical contact pads 13. During this process, electrical contact pads or electrical traces may be formed on the top surface 10b of the PCB 10, which are not shown for simplicity.

Figure 3B:
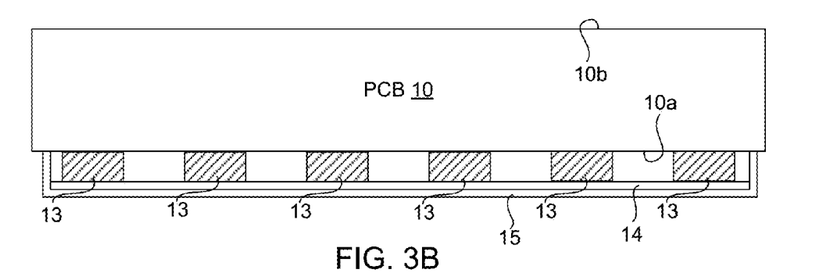

With reference to FIG. 3B, a film 14 for assisting a subsequent molding process is placed in contact with the bottom surfaces of the electrical contact pads 13 and a mold tool 15 is placed in contact with the film 14 and a force is applied by the mold tool 15 against the film 14. Although the electrical contact pads 13 generally have the same heights corresponding to the distance from the bottom surface 10a of the PCB to the bottom surfaces of the electrical contact pads 13 in directions normal to those surfaces, there may be slight variations in height due to tolerances of the processes used to form the PCB 10 and the electrical contact pads 13. The film 14 conforms to the bottom surfaces of the electrical contact pads 13 such that the spaces in between the electrical contact pads 13 are of precisely the same height and ensures that none of the encapsulating mold compound that is used to make the molded solder mask will overlap the bottom surfaces of the electrical contact pads 13.

Figure 3C:
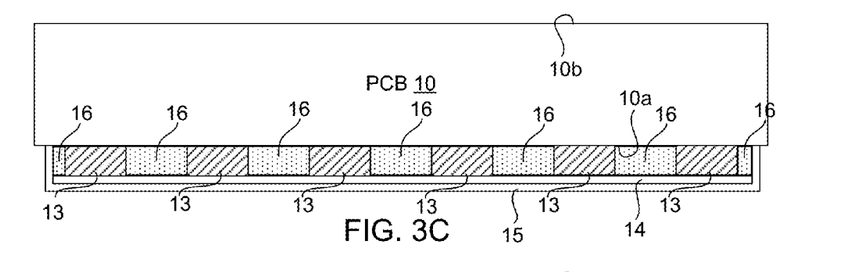
Figure 3D:
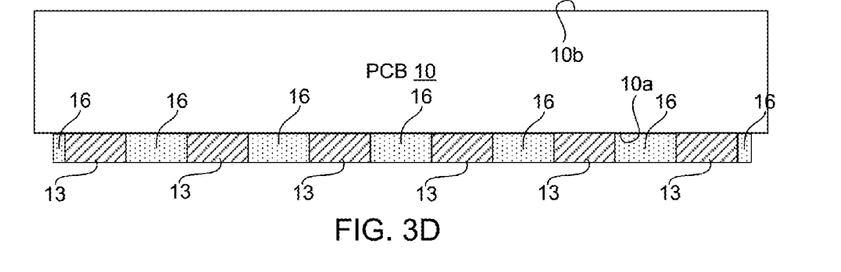

With reference to FIG. 3C, after the film 14 and the mold tool 15 are in the position shown in FIGS. 3B and 3C, the encapsulating mold compound 16 is inserted, or dispensed, into the empty spaces, or cavities, that exist in between the electrical contact pads 13 and the film-assisted mold tool 15. The encapsulating mold compound 16 is typically a reinforced or non-reinforced epoxy resin, but may be any suitable material, such as those described above, for example. Reinforced epoxy has reinforcing particles, or fillers, dispersed throughout. With reference to FIG. 3D, once the encapsulating mold compound 16 has been cured, or hardened, the film 14 and the mold tool 15 are removed, leaving the cured encapsulated mold compound 16 disposed in between and in contact with the side walls of the electrical contact pads 13. The cured encapsulating mold compound 16 comprises the molded solder mask. The cured encapsulating mold material 16 has a shape that is dictated by the shape of the mold cavity of the mold tool 15. In other words, the shape of the cured encapsulated mold material 16 is complementary to the shape of the inner surfaces of the mold cavity of the mold tool 15.

The molding process is typically an injection molding or a transfer molding process, although a compression molding process could also be used for this purpose. Any of these molding processes will ensure that the solder mask 16 has the desired thickness, which in this example is equal to the height of the electrical contact pads 13 within a few microns, and will ensure that no gaps exist between the side walls of the electrical contact pads 13 and the solder mask 16. If a compression molding process is used, the encapsulating mold compound 16 is placed in the cavities between the electrical contact pads 13 prior to the film 14 and the mold tool 15 being brought into the position shown in FIG. 3C, in which case the pressure exerted by the mold tool 15 will compress the encapsulating mold compound 16 into the shape shown in FIG. 3D. Once the molding process has been completed, the encapsulating mold compound has a shape that is complementary to the shape of inner surfaces of the cavity of the mold tool 15.

Figure 3E:
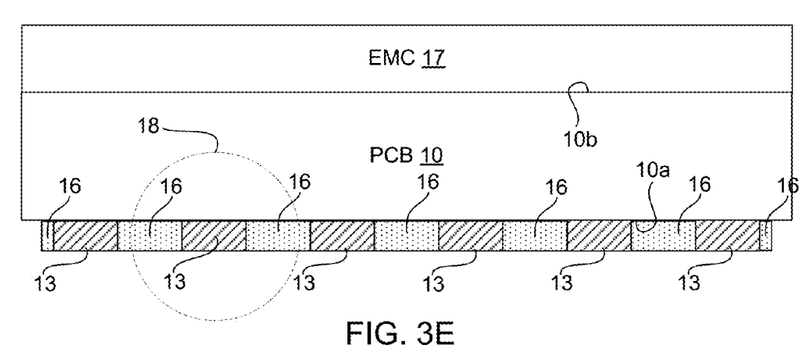

At some point during the process of fabricating the PCB 10, one or more electrical, electronic and/or optoelectronic components are mounted on the top surface 10b of the PCB 10 and electrically interconnected to electrical conductors (e.g., electrical contact pads) of the PCB 10 using typical surface mount technology (SMT). A known molding process is then used to over-mold an encapsulating mold compound (EMC) 17 onto the PCB 10 that encapsulates and protects the components mounted on the top surface 10b of the PCB 10 and electrical conductors disposed on the top surface 10b of the PCB 10. The PCB 10 having the EMC 17 over-molded onto it is shown in FIG. 3E. Once the components have been mounted on the top surface of the PCB and the EMC has been over-molded onto the PCB 10, the resulting device is typically referred to as a PCB assembly. In accordance with this exemplary embodiment, the molded solder mask 16 is formed prior to the EMC 17 being over-molded onto the PCB 10. As will be described below with reference to FIGS. 5A-5E, the molded solder mask may be formed after the EMC has been over-molded onto the PCB.

Figure 4:
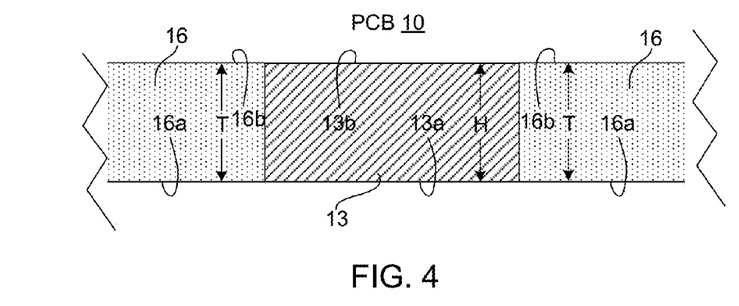
FIG. 4 illustrates an enlarged cross-sectional view of a portion of the PCB shown in FIG. 3E.

FIG. 4 illustrates an enlarged cross-sectional view of the portion of the PCB 10 contained in the dashed circle 18 in FIG. 3E. As indicated above, in accordance with this exemplary embodiment, the molded solder mask 16 is formed such that the bottom surface 16a of the molded solder mask 16 is co-planar, or flush, with the bottom surfaces 13a of the electrical contact pads 13. In other words, the height, H, of the electrical contact pads 13 (i.e., the distance from the bottom surfaces 13a to the top surfaces 13b of the electrical contact pads 13) is equal to the thickness, T, of the molded solder mask 16 (i.e., the distance from the bottom surface 16a to the top surface 16b of the molded solder mask 16). As indicated above, this is not possible when using the aforementioned known approach to form a solder mask, which typically has a thickness that is at least about 15 microns greater than the height of the electrical contact pads. Also, no gaps exist between the side walls of the electrical contact pads 13 and the molded solder mask 16.

With reference again to FIG. 3E, the EMC 17 that is over-molded onto the top surface 10b of the PCB 10 can result in warpage of the PCB 10. The amount or extent of the warpage can be reduced by the presence of the molded solder mask 16 on the bottom surface 10a of the PCB 10. The extent to which the presence of the molded solder mask 16 reduces warpage depends on the encapsulating mold compounds that are used for the EMC 17 and for the molded solder mask 16, the volumes of material that are used for the EMC 17 and the molded solder mask 16 and the CTEs of the compounds that are used for the EMC 17 and for the molded solder mask 16. Because the EMC 17 is typically 10 to 20 times thicker than the molded solder mask 16, choosing an encapsulating mold compound for the molded solder mask 16 that has a CTE that is significantly higher than the CTE of the EMC 17 can have a significant effect on reducing warpage and will typically result in a reduction in warpage of anywhere from 2% to 15%. However, as indicated above, in some cases the same encapsulating mold compound that is used for the EMC 17 may also be used for the molded solder mask 16.

FIGS. 5A-5E illustrate cross-sectional views of a PCB 20 during various processing steps that are performed in accordance with another exemplary embodiment to form the molded solder mask of an encapsulating mold compound on a bottom surface of the PCB 20. In accordance with this embodiment, an EMC 21 is over-molded onto the PCB 20 prior to the molded solder mask being formed, as will now be described with reference to FIGS. 5A-5E.

Figure 5A:
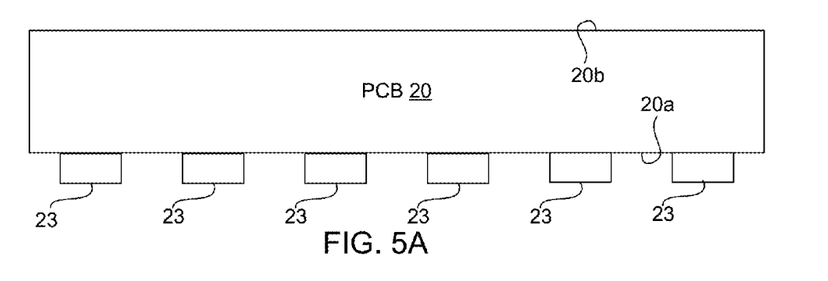
FIGS. 5A-5E illustrate cross-sectional views of various stages of a fabrication process in accordance with another exemplary embodiment for forming a solder mask by encapsulating the bottom surface of a PCB with an encapsulating mold material and using a mold tool to impart a predetermined shape to the encapsulating mold material.
Figure 5B:
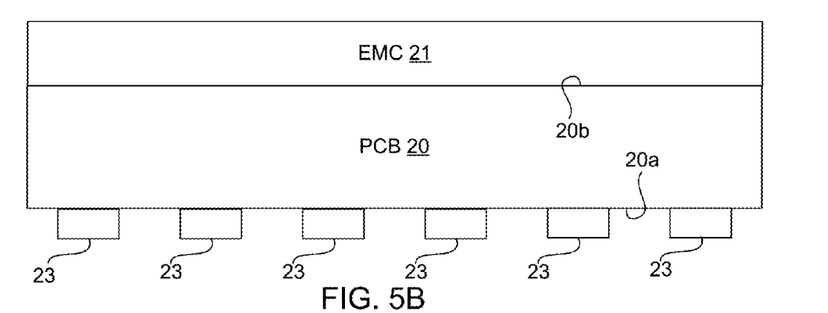

With reference to FIG. 5A, an array of electrical contact pads 23 is formed on the bottom surface 20a of the PCB 20 in the manner described above with reference to FIG. 3A. The array of electrical contact pads 23 may be, for example, an LGA. During this process, electrical contact pads and/or electrical traces are typically also formed on the top surface 20b of the PCB 20, which are not shown for simplicity. One or more electrical, electronic and/or optoelectronic components (not shown) are then mounted on the top surface 20b of the PCB 20 and electrically interconnected to the PCB 20 using typical SMT processes. With reference to FIG. 5B, a known molding process is then used to over-mold an EMC 21 onto the PCB 20 that encapsulates and protects the components mounted on the top surface 20b of the PCB 20.

Figure 5C:
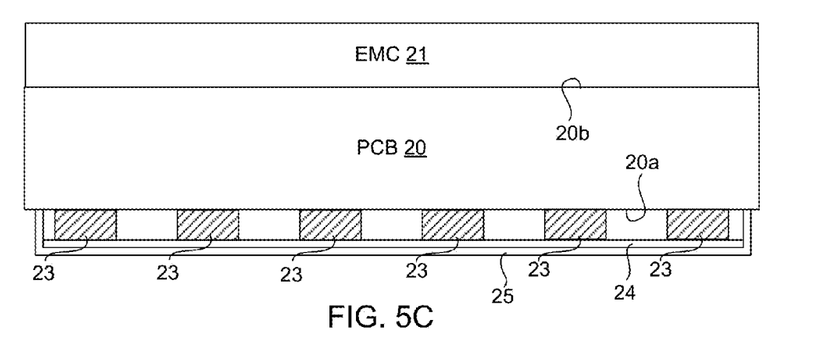
Figure 5D:
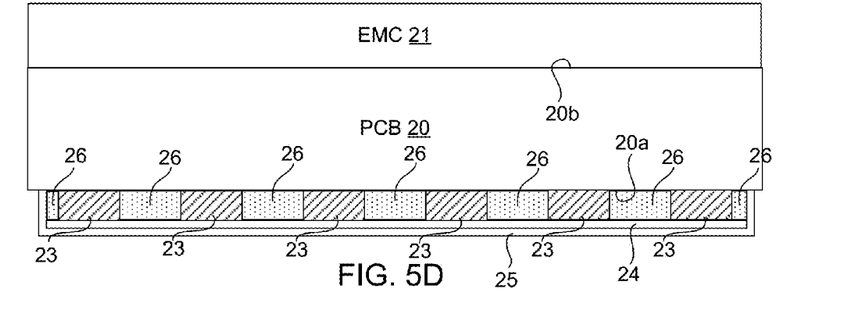

With reference to FIG. 5C, a film 24 for assisting a subsequent molding process is placed in contact with the bottom surfaces of the electrical contact pads 23 and a mold tool 25 is placed in contact with the film 24. A force is applied by the mold tool 25 against the film 24 to ensure good contact between the film 24 and the electrical contact pads 23. After the film 24 and the mold tool 25 have been placed in the position shown in FIG. 5C, the molding process described above is performed. With reference to FIG. 5D, once the encapsulating mold compound 26 has been cured, the film 24 and the mold tool 25 are removed, leaving the cured encapsulated mold compound 26 disposed in between and in contact with the side walls of the electrical contact pads 23. The cured encapsulating mold compound 26 comprises the molded solder mask. As described above, the molding process is typically an injection molding or a transfer molding process, but a compression molding process could also be used for this purpose. Any of these molding processes will ensure that the solder mask 26 has the desired thickness, which in this example is equal to the height of the electrical contact pads 23 within a few microns, and will ensure that no gaps exist between the side walls of the electrical contact pads 23 and the molded solder mask 26.

Figure 5E:
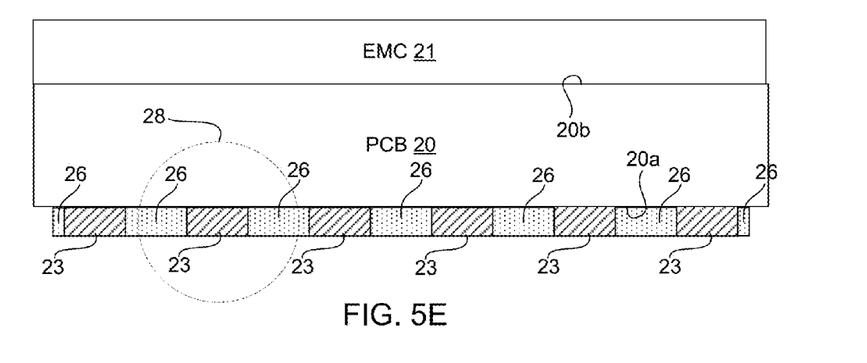

With reference to FIG. 5E, the film 24 and the mold tool 25 are removed, leaving the molded solder mask 26 disposed in between and in contact with the electrical contact pads 23. The cured encapsulating mold compound comprising the molded solder mask 26 has a shape that is complementary to the shape of the cavity of the mold tool 25.

Figures 6, 7:
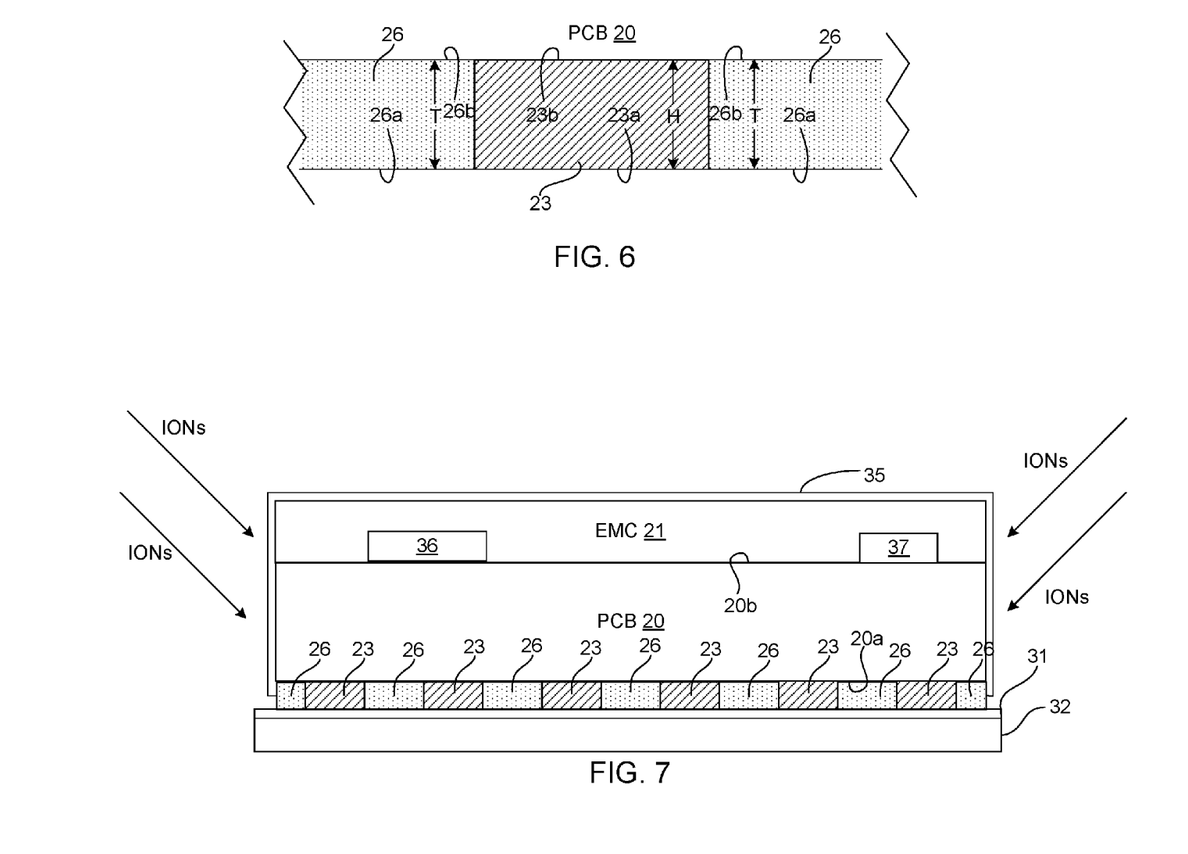
FIG. 6 illustrates an enlarged cross-sectional view of a portion of the PCB shown in FIG. 5E.
FIG. 7 illustrates a cross-sectional view of the PCB shown in FIGS. 5E and 6 during the process of using metal sputtering process to form an EMI shield on the PCB in accordance with an illustrative embodiment.

FIG. 6 illustrates an enlarged cross-sectional view of the portion of the PCB 20 contained in the dashed circle 28 shown in FIG. 5E. As indicated above, in accordance with this exemplary embodiment, the molded solder mask 26 is formed such that the bottom surface 26a of the molded solder mask 26 is co-planar, or flush, with the bottom surfaces 23a of the electrical contact pads 23. In other words, the height, H, of the electrical contact pads 23, i.e., the distance from the bottom surfaces 23a to the top surfaces 23b of the electrical contact pads 13, is equal to the thickness, T, of the molded solder mask 26, i.e., the distance from the bottom surface 26a to the top surface 26b of the molded solder mask 26. The placement of the mold tool 25, assisted by the film 24, against the bottom surfaces of the electrical contact pads 23 ensures that none of the cured encapsulation mold compound comes into contact with the bottom surfaces of the electrical contact pads. This also ensures that no residue from the molding process will be present on the bottom surfaces of the electrical contact pads 23. As indicated above, this is not possible when using the aforementioned known approach to form a solder mask. Also, no gaps exist between the side walls of the electrical contact pads 23 and the molded solder mask 26, which do result in some cases when using the aforementioned known approach to form a solder mask.

As indicated above, the process of forming the molded solder mask also allows the molded solder mask to be used with electrical contact pads that are great in height without localized bowing, or drawbridging, occurring. As indicated above, with the traditional process of forming a solder mask, the solder mask is at least about 15 microns greater in thickness than the height of the electrical contact pads. As the height of the electrical contact pads is increased, the thicker solder mask adds a lot of weight that can cause localized bowing. The risk of localized bowing occurring with the molded solder mask is reduced by ensuring that the bottom surface of the molded solder mask is flush, or co-planar, with the bottom surfaces of the electrical contact pads. For example, with the molded solder mask, the risk of localized bowing is minimal for heights of the electrical contact pads not greater than about 30 microns. With the traditional solder mask, the risk of localized bowing occurs for much smaller heights of the electrical contact pads due to the additional weight of the solder mask, which limits the heights that the electrical contact pads can have.

As also indicated above, the molded solder mask can be precisely and reliably formed even in cases where the pitch between adjacent electrical contact pads is very small, e.g., less than 400 microns, which is generally not possible using the known process to form the solder mask. For example, it is possible to use the molded solder mask when the pitch between adjacent electrical contact pads is 350 microns or less, which provides additional benefits in terms of smaller PCB assemblies and smaller package sizes for packages that incorporate the PCB assemblies. With the conventional photolithographic solder mask formation process, the process of masking the exposed electrical contact pads when depositing the dielectric material of the solder mask has an alignment tolerance of about ±25 microns for a total of 50 microns of alignment tolerance (i.e., 25 microns in two directions that are opposite one another). Because this alignment process is not needed when forming the molded solder mask of the present disclosure, the 50 microns of alignment tolerance that is not needed translates into a reduction in pitch by that same amount. For this reason, the pitch can be reduced to 350 microns or less when using the process for forming the molded solder mask described herein compared to a minimum pitch of about 400 microns currently achievable using the convention solder mask formation process.

Yet another benefit of the molded solder mask is that it can be used to protect the bottom surface of the PCB from problems with metal back spill and metal burrs that can otherwise occur during the process of forming an electromagnetic interference (EMI) shield on the PCB, as will now be described with reference to FIG. 7. Metal burrs are accumulations of metal residue on the package side wall that can occur when forming an EMI shield on the package and may result in electronic problems, such as non-wetting of solder and electrical short circuits, for example. During the typical PCB fabrication process, after the EMC has been over-molded onto the top surface of the PCB, the bottom surface of the PCB having the solder mask on it is placed in contact with a surface of a solid metal jig having an elastomer or adhesive tape on it. A metal sputtering process is then performed during which the top and side surfaces of the PCB and EMC over-mold are bombarded with metal ions. The jig and the adhesive tape or elastomer in contact with the bottom surface of the PCB are intended to prevent metal ions from coming into contact with the bottom surface of the PCB. However, because of the unevenness, or non-planarity, of the bottom surface of the conventional solder mask and the bottom surfaces of the electrical contact pads (FIG. 1B), it is possible for some of the metal ions to accumulate on the bottom surfaces of the solder mask and/or the electrical contact pads. Backspill corresponds to the accumulation of metal ions on these bottom surfaces. Metal burrs correspond to accumulations of metal ions on the side walls of the over-molded PCB adjacent its bottom surface. Both conditions can lead to electronic problems such as, for example, non-wetting of solder and electrical short circuits.

FIG. 7 illustrates a cross-sectional view of the PCB 20 shown in FIG. 5E during the process of using metal sputtering process to form an EMI shield 25 on the PCB 20, and also having an electrical component 36 and an optoelectronic component 37 mounted on the top surface 20b of, and electrically interconnected with, the PCB 20. The electrical and optoelectronic components 36 and 37, respectively, are mounted on the top surface 20b of the PCB 20 prior to over-molding the EMI 21 onto the PCB 20. The relationship between the molded solder mask 26 and the electrical contact pads 23 is as depicted in FIG. 6, i.e., the bottom surfaces 26a and 23a of the solder mask 26 and of the electrical contact pads 23, respectively, are co-planar, or flush with one another. The bottom surfaces 26a and 23a are in contact with an adhesive tape or elastomer 31 disposed on a top surface of a metal jig 32. The arrows labeled "IONs" represent the metal sputtering process being used to form an EMI shield 25 on the PCB assembly. Because of the co-planarity of the surfaces 26a and 23a, ions are incapable of accumulating on those surfaces, thereby preventing backspill. Even if any metal burrs occur along the side walls of the PCB 20 adjacent its bottom surface 20a, the portions of the molded solder mask 26 along the outer perimeter of the array of electrical contact pads 23 will prevent the ions from coming into contact with any of the electrical contact pads 23 or with any other electrical conductors (not shown) disposed on the bottom surface 20a of the PCB 20.

Yet another advantage of the molded solder mask over the conventional solder mask is that the process of forming the molded solder mask does not leave residue on the bottom surfaces of the electrical contact pads. In contrast, because the process of forming the conventional solder mask first covers the bottom surfaces of the electrical contact pads with the dielectric material of which the solder mask is formed, a thin layer of dielectric residue often remains on the bottom surfaces of the electrical contact pads even after those surfaces have been cleaned. This residue can detrimentally affect the integrity of the electrical interconnections between the electrical contact pads and external circuitry (e.g., a system PCB). Because the mold material that is used to form the molded solder mask never comes into contact with the bottom surfaces of the electrical contact pads, there is no residue left behind on those surfaces to detrimentally impact the integrity of the electrical interconnections.

Figure 8:
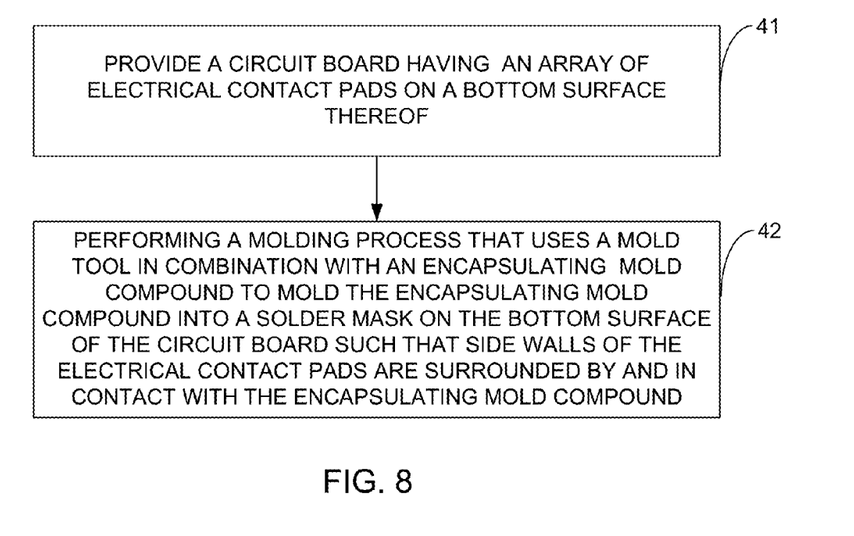
FIG. 8 is a flow diagram that represents the method of forming a solder mask by encapsulating the bottom surface of a PCB with an encapsulating mold material and using a mold tool to impart a predetermined shape to the encapsulating mold material.

FIG. 8 illustrates a flow diagram of the process for forming a molded solder mask on a bottom surface of a circuit. A circuit board is provided having an array of electrical contact pads disposed on a bottom surface thereof, as indicated by block 41. A molding process that uses a mold tool in combination with an encapsulating mold compound is then used to mold the encapsulating mold compound into a solder mask on the bottom surface of the circuit board such that side walls of the electrical contact pads are surrounded by and in contact with the encapsulating mold compound, as indicated by block 42. As indicated above, the molding process that is used is typically an injection molding process, a transfer molding process or a compression molding process, and the mold material is typically reinforced or non-reinforced epoxy resin.

Figure 9:
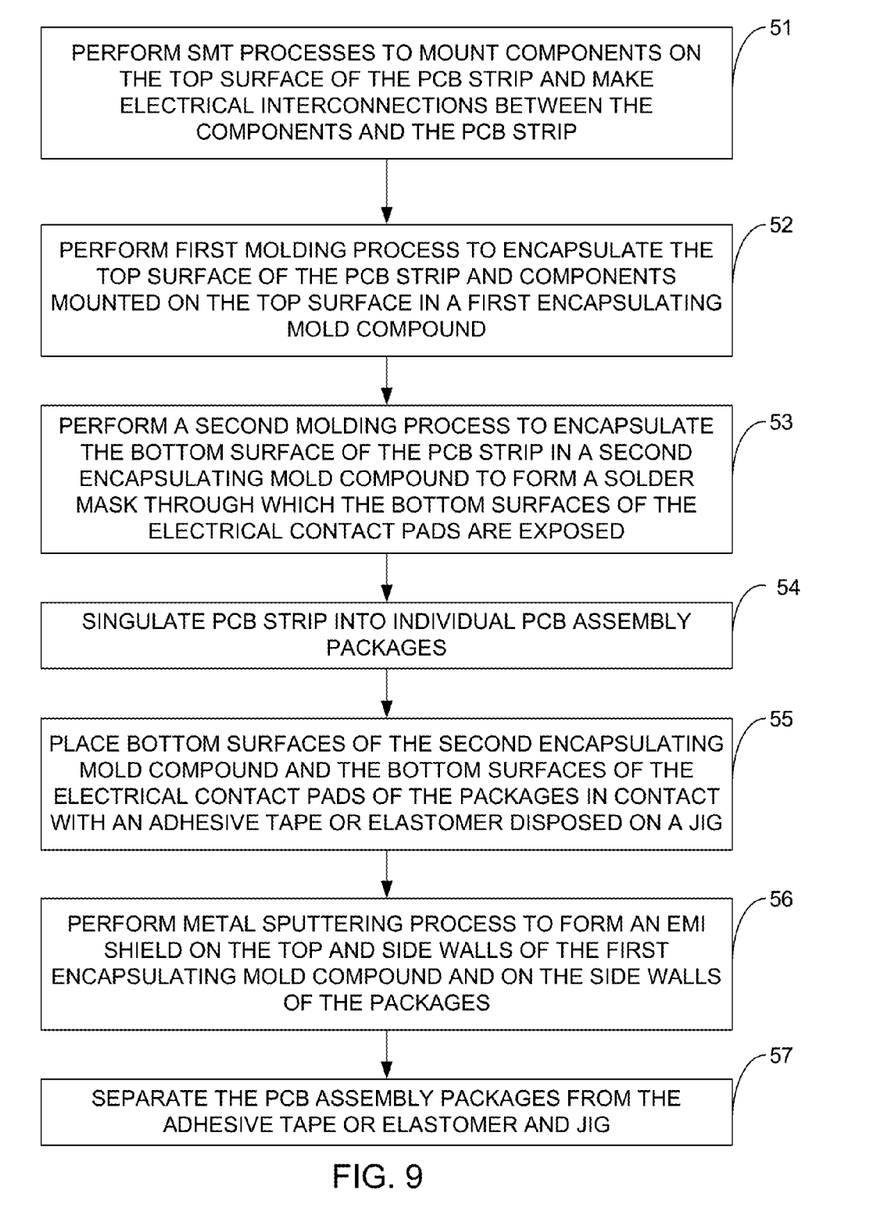
FIG. 9 is a flow diagram that represents an illustrative embodiment of the process described above with reference to FIG. 7 of using a metal sputtering process to form an EMI shield on the PCB.

FIG. 9 is a flow diagram that represents an illustrative embodiment of the process described above with reference to FIG. 7 of using a metal sputtering process to form an EMI shield on the PCB. An automated SMT process is used to mount electrical, electronic and/or optoelectronic components on the top surface of a PCB strip and to electrically interconnect the components with circuitry of the PCB strip, as indicated by block 51. A first molding process is then performed to encapsulate the top surface of the PCB strip and the components mounted thereon in a first encapsulating mold compound, as indicated by block 52. A second molding process is performed to encapsulate the bottom surface of the PCB strip in a second encapsulating mold compound to form a solder mask through which bottom surfaces of the electrical contact pads are exposed, as indicated by block 53. During the process represented by block 53, gaps will typically be left in the second encapsulating mold compound at boundaries between adjacent portions of the strip that will subsequently be used as saw streets during the subsequent singulation process. Leaving gaps in the second encapsulating mold compound for the saw streets avoids having to saw through the second encapsulating mold compound, which reduces contaminants or debris that typically results from the sawing process.

After the second molding process has been performed, the PCB strip is singulated into individual PCB assembly packages, as indicated by block 54. The bottom surfaces of the PCB assembly packages are placed in contact with an adhesive tape, film or elastomer disposed on a top surface of a jig, as indicated by block 55. A metal sputtering process is then performed to form EMI shields on the PCB assembly packages, as indicated by block 56. The PCB assembly packages are then separated from the adhesive tape, film or elastomer and the jig, as indicated by block 57.

As discussed above with reference to FIG. 7, because of the co-planarity of the bottom surfaces of the second encapsulating mold compound and the electrical contact pads, the contact between those surfaces and the adhesive tape, film or elastomer prevents ions from accumulating on those surfaces, thereby preventing backspill. Even if any metal burrs occur along the side walls of the PCB assembly packages adjacent their bottom surfaces, the portions of the second encapsulating mold compound along the outer perimeters of the arrays of electrical contact pads will prevent the ions from coming into contact with any of the electrical contact pads or with any other electrical conductors (not shown) disposed on the bottom surfaces of the PCB assembly packages.

It should be noted that the invention has been described with reference to a few illustrative, or exemplary, embodiments for the purpose of demonstrating principles and concepts of the invention. It will be understood by persons of skill in the art, in view of the description provided herein, that the invention is not limited to these embodiments. Persons of skill in the art will understand that many variations can be made to the illustrative embodiments without deviating from the scope of the invention.

What is claimed is:

1. A circuit board comprising:
   an array of metal electrical contact pads disposed on a bottom surface of the circuit board, the array of metal electrical contact pads having a height equal to a distance from the bottom surface of the circuit board to bottom surfaces of the metal electrical contact pads;
   a cured first encapsulating mold compound formed on the bottom surface of the circuit board, bottom surfaces of the metal electrical contact pads being exposed through respective openings formed in the cured first encapsulating mold compound, the cured first encapsulating mold compound extending in between the array of metal electrical contact pads such that side walls of each of the array of metal electrical contact pads are surrounded by and in contact with the cured first encapsulating mold compound, the cured first encapsulating mold compound having a shape that is complementary to a shape of a cavity of a mold tool; and
   a cured second encapsulating mold compound formed on a top surface of the circuit board, wherein the cured first encapsulating mold compound has a coefficient of thermal expansion (CTE) that is higher than a CTE of the cured second encapsulating mold compound, and wherein the higher CTE of the cured first encapsulating mold compound prevents or reduces warpage of the circuit board by the cured second encapsulating mold compound.

2. The circuit board of claim 1, wherein the cured first encapsulating mold compound is cured epoxy resin.

3. The circuit board of claim 2, wherein the cured epoxy resin is cured reinforced epoxy resin having reinforcing particles therein.

4. The circuit board of claim 2, wherein the cured epoxy resin is cured non-reinforced epoxy resin devoid of reinforcing particles therein.

5. The circuit board of claim 1, wherein the cured first encapsulating mold compound has a thickness that is less than or equal to the height of the array of metal electrical contact pads plus 3 micrometers.

6. The circuit board of claim 1, wherein the cured first encapsulating mold compound has a thickness that is determined by the shape of the cavity of the mold tool.

7. The circuit board of claim 1, wherein the cured first encapsulating mold compound has a thickness that is less than or equal to the height of the array of metal electrical contact pads minus 3 micrometers.

8. The circuit board of claim 1, wherein a pitch between adjacent metal electrical contact pads is less than 400 micrometers.

9. The circuit board of claim 8, wherein a pitch between adjacent metal electrical contact pads is less than or equal to 350 micrometers.

10. The circuit board of claim 1, wherein the cured first encapsulating mold compound is in continuous contact with the side walls of the array of metal electrical contact pads such that no gap exists between the cured first encapsulating mold compound and any of the side walls of the array of metal electrical contact pads.

11. The circuit board of claim 1, wherein the bottom surfaces of the metal electrical contact pads are devoid of dielectric residue.

12. The circuit board of claim 1, wherein the bottom surface of the circuit board is devoid of the cured first encapsulating mold compound at an intersection of at least one side wall of the circuit board and the bottom surface of the circuit board.

13. The circuit board of claim 1, wherein the circuit board has side walls and a top surface, the circuit board further comprising:
   at least one of an electrical, electronic and optoelectronic component mounted on the top surface of the circuit board and electrically interconnected with the circuit board,
   the cured second encapsulating mold compound encapsulating the top surface of the circuit board and said at least one of an electrical, electronic and optoelectronic component; and
   an electromagnetic interference (EMI) shield comprising a metallic material covering outer surfaces of the cured second encapsulating mold compound and the side walls of the circuit board, wherein the cured first encapsulating mold compound disposed on the bottom surface of the circuit board ensures that the bottom surface of the circuit board is devoid of the metallic material of the EMI shield.

14. A circuit board assembly comprising:
a circuit board comprising:
an array of metal electrical contact pads disposed on a bottom surface of the circuit board, the array of metal electrical contact pads having a height equal to a distance from the bottom surface of the circuit board to bottom surfaces of the array of metal electrical contact pads; and
a cured first encapsulating mold compound formed on the bottom surface of the circuit board and extending in between the array of metal electrical contact pads such that side walls of each of the array of metal electrical contact pads are surrounded by and in contact with the cured first encapsulating mold compound; and
at least one of an electrical, electronic and optoelectronic component mounted on a top surface of the circuit board and electrically interconnected with the circuit board; and
a cured second encapsulating mold compound encapsulating the top surface of the circuit board and said at least one of an electrical, electronic and optoelectronic component, the cured first encapsulating mold compound having a coefficient of thermal expansion (CTE) that is higher than a CTE of the cured second encapsulating mold compound, and wherein the higher CTE of the cured first encapsulating mold compound prevents or reduces warpage of the circuit board by the cured second encapsulating mold compound.

15. The circuit board assembly of claim 14, wherein the cured first encapsulating mold compound is cured epoxy resin.

16. The circuit board assembly of claim 15, wherein the cured epoxy resin is cured reinforced epoxy resin having reinforcing particles therein.

17. The circuit board assembly of claim 15, wherein the cured epoxy resin is cured non-reinforced epoxy resin devoid of reinforcing fibers therein.

18. The circuit board assembly of claim 14, wherein the cured first encapsulating mold compound has a thickness equal to a distance from the bottom surface of the circuit board to a bottom surface of the cured first encapsulating mold compound, and wherein the height of the array of metal electrical contact pads is substantially the same as the thickness of the cured first encapsulating mold compound.

19. The circuit board assembly of claim 14, wherein a bottom surface of the cured first encapsulating mold compound and the bottom surfaces of the electrical contact pads are substantially co-planar with one another.

20. The circuit board assembly of claim 14, wherein no overlap exists between a bottom surface of the cured first encapsulating mold compound and the bottom surfaces of the metal electrical contact pads.

21. The circuit board assembly of claim 14, wherein the bottom surface of the circuit board is exposed between an outer peripheral edge of the cured first encapsulating mold compound and a sidewall of the circuit board.

22. The circuit board assembly of claim 14, wherein the cured first encapsulating mold compound is in continuous contact with the side walls of the array of metal electrical contact pads such that no gap exists between the cured first encapsulating mold compound and any of the side walls of the array of metal electrical contact pads.

* * * * *